(12) United States Patent
Goh

(10) Patent No.: US 10,690,721 B2
(45) Date of Patent: Jun. 23, 2020

(54) ADAPTIVE GLITCH DETECTOR FOR SYSTEM ON A CHIP

(71) Applicant: STMicroelectronics Asia Pacific Pte Ltd, Singapore (SG)

(72) Inventor: Beng-Heng Goh, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 21 days.

(21) Appl. No.: 16/128,645

(22) Filed: Sep. 12, 2018

(65) Prior Publication Data

US 2020/0081062 A1  Mar. 12, 2020

(51) Int. Cl.

| | |
|---|---|
| *G01R 31/00* | (2006.01) |
| *G06F 1/10* | (2006.01) |
| *H03K 3/00* | (2006.01) |
| *H03K 5/00* | (2006.01) |
| *H03K 19/20* | (2006.01) |
| *G01R 31/3177* | (2006.01) |
| *H03K 5/133* | (2014.01) |

(52) U.S. Cl.
CPC .......... *G01R 31/3177* (2013.01); *G06F 1/10* (2013.01); *H03K 5/133* (2013.01); *H03K 19/20* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 7,716,001 B2 | 5/2010 | Lee et al. | |
| 8,228,106 B2 | 7/2012 | Baumann et al. | |
| 8,519,768 B2 * | 8/2013 | Baumeister | G06F 1/10 |
| | | | 327/291 |

(Continued)

FOREIGN PATENT DOCUMENTS

| | | |
|---|---|---|
| WO | 2005052771 A1 | 6/2005 |
| WO | 2010062547 A1 | 6/2010 |

OTHER PUBLICATIONS

Lamoureux, Julien et al: "GlitchLess: An Active Glitch Minimization Technique for FPGAs," University of British Columbia, 2007 (11 pages).

(Continued)

*Primary Examiner* — Justin R Knapp
(74) *Attorney, Agent, or Firm* — Crowe & Dunlevy

(57) ABSTRACT

A glitch detector includes an input flip-flop clocked by a clock signal and having a non-inverting data output, an inverting data output, and a data input receiving input from the inverting data output, the input flip-flop generating a divided version of the clock signal at the non-inverting data output. A configurable delay chain receives the divided version of the clock signal and generates a delayed version of the divided version of the clock signal as a delay output. An intermediate flip-flop clocked by the clock signal has a data input receiving the delay output, the intermediate flip-flop generating an intermediate output as a function of the delay output. A logic circuit receives the divided version of the clock signal and the intermediate output, and generates a glitch detect signal by performing a logical operation on the divided version of the clock signal and the intermediate output.

17 Claims, 16 Drawing Sheets

(56) References Cited

U.S. PATENT DOCUMENTS

| | | | |
|---|---|---|---|
| 8,558,579 B2* | 10/2013 | Zhang | ................ H03K 5/1252 |
| | | | 327/31 |
| 9,285,824 B2 | 3/2016 | Zhu et al. | |
| 2002/0120880 A1 | 8/2002 | Simon et al. | |
| 2006/0107011 A1 | 5/2006 | Nystuen et al. | |
| 2008/0010479 A1 | 1/2008 | Fortin et al. | |
| 2009/0024888 A1* | 1/2009 | Kurimoto | ........ G01R 31/31858 |
| | | | 714/731 |

OTHER PUBLICATIONS

Plessas, F. et al: "Advanced Calibration Techniques for High-Speed Source—Synchronous Interfaces," The Institution of Engineering and Technology 2011, vol. 5, Iss. 5, pp. 366-374.

* cited by examiner

ADAPTIVE GLITCH DETECTOR FOR SYSTEM ON A CHIP

TECHNICAL FIELD

This disclosure is related to an adaptive glitch detector for a system on a chip enabling not only glitch detection, but also determination of the state of the system on a chip.

BACKGROUND

A system on a chip (SOC) is an integrated circuit that integrates the various components of a computer or other electronic system onto a single substrate. A typical SOC includes one or more microprocessor cores, non-volatile memory, volatile memory, clock signal generators, peripheral interfaces, voltage regulators, external digital interfaces, and external analog interfaces.

Due to temperature, age, operating conditions, or external attacks, a SOC may operate improperly, and such improper operation may be referred to as a "glitch". By monitoring or analyzing the main clock of the SOC, such glitches can be detected.

Sample types of glitches that can be detected are shown in the timing diagram of FIG. 1. Here, first note the glitch labeled "1"—this is the type of glitch resulting from a spurious rising of the clock signal, which can lead to a setup violation or other incorrect operation of a SOC. Similarly, another type of glitch can result from the clock signal running at an unintended frequency, such as being inadvertently overclocked.

Still another type of glitch that can be detected is the delay of data due to variations in the threshold of transistors due to age or other factors. One example of this is shown as the glitch labeled "2", where the data should be latched at the rising edges of the clock signal, but instead is latched a delay period after the rising edges of the clock signal.

A further type of glitch that can be detected is the shifting of edges of the clock signal due to electromagnetic interference, shown here as the glitch labeled "3". Note that this glitch is particularly concerning, as the shifting of clock edges can result in data signal shifting and setup violations, among other issues.

A first prior art glitch detector 50 is shown in FIG. 2A. This glitch detector 50 is incorporated within a SOC 49. By being incorporated within the SOC 49, the glitch detector 50 can be assumed to be subject to the same glitches as the SOC 49, and therefore proper or improper operation of the SOC 49 can be inferred from output of the glitch detector 50.

The glitch detector 50 is comprised of an input flip flop 51, a delay chain 52, a first output flip flop 53, a second output flip flop 54, an XOR gate 55, and a finite state machine (FSM) 56. In greater detail, the input flip flop 51 receives the SOC clock signal CLK at its clock input, receives the output of its QN output at its D input, and has its Q output coupled to an input of the delay chain 52. The delay chain 52 has delay elements 52a . . . 52d selectable in number by the finite state machine 56. The first output flip flop 53 receives the SOC clock signal CLK at its clock input, receives output from the delay chain 52 (the CLK_div2 delay signal) at its D input, and has its Q output coupled to the exclusive-OR (XOR) gate 55. The second output flip flop 54 receives the SOC clock signal CLK at its clock input, receives output from the Q output of the input flip flop 51 (the CLK_div2 signal) at its D input, and has its Q output coupled to the XOR gate 55. The XOR gate, receiving the Q outputs of the first and second output flip flops 53 and 54 at its inputs, outputs a glitch detect flag Glitch_detect.

Each delay inserted by a delay block 52a-52d of the delay chain 52 is set to be equal to slightly less than the period of the SOC clock signal CLK. Therefore, if the Q outputs of the first output flip flop 53 and the second output flip flop 54 are equal at the rising edge of the SOC clock signal CLK, it can be inferred that there is not a glitch in the current operation of the SOC 49, and the Glitch_detect flag can accordingly indicate a lack of the glitch. However, if the Q outputs of the first output flip flop 53 and the second output flip flop 54 are not equal at the rising edge of the SOC clock signal CLK, it can be assumed that there has been a disturbance resulting in a glitch in the current operation of the SOC 49, and the Glitch_detect flag can accordingly indicate the presence of the glitch. Progressively increased delays of the SOC clock signal CLK can be seen in FIG. 2B.

Operation of the glitch detector 50 itself is shown in the timing diagram of FIG. 2C. Here, no glitch is present, as it can be noticed that the Q outputs of the first output flip flop 53 and second output flip flop 54 (respectively labeled Q.53 and Q.54) are equal at rising edges of the SOC clock signal CLK—stated another way, it can be seen that the CLK_div2 and CLK_div2 delay signals are equal at the rising edge of the SOC clock signal CLK, so there is no glitch detected.

Operation of the glitch detector 50 in the presence of a glitch is shown in the timing diagram of FIG. 2D. At time t1, it can be seen that CLK_div2 spuriously rises. The result of this is that the output of flip flop 54 (labeled as Q.54) does not fall at time t2 like it otherwise would. Therefore, between time t2 and t3, the output of flip flop 54 is high while the output of flip flop is low, with the result being that the XOR gate 55 outputs Glitch_detect as a logic high between times t2 and t3 to indicate occurrence of a glitch.

A second prior art glitch detector 50' is shown in FIG. 3A. This glitch detector 50 is incorporated within a SOC 49. By being incorporated within the SOC 49, the glitch detector 50' can be assumed to be subject to the same glitches as the SOC 49, and therefore operation of the circuitry of the glitch detector 50' can indicate the presence of glitches with the operation of the SOC 49.

The glitch detector 50' is comprised of a delay chain 52, an output flip flop 53, and a finite state machine (FSM) 56. The delay chain 52 has delay elements 52a . . . 52d selectable in number by the finite state machine 56, with the first delay element 52a receiving the data signal as input. The output flip flop 53 receives the delayed version of the data signal (delayed by the delay elements 52a . . . 52d) at its clock input, the (not delayed) data signal at its D input, and generates the Glitch_detect flag at its QN output (complement of the Q output). Note that there is a bubble at the CLK input, indicating that the delayed version of the data signal is inverted before being read by the output flip flop 53, having the effect of making the output flip flop 53 falling edge triggered with respect to the SOC clock signal CLK as opposed to rising edge triggered.

As can be appreciated, once glitch detection is begun, at each falling edge of the delayed version of the clock signal received at the clock input of the output flip flop 53, the data signal is latched as the Glitch_detect signal at the QN output of the output flip flop 53. Due to the delay, in the absence of a glitch, at each falling edge of the delayed version of the clock signal, the data signal should be at a logic high, and thus the Glitch_detect flag at the QN output of the output flip flop 53 should remain low, indicating a lack of a glitch. However, if there has been a glitch in the data signal that results in a rising edge of the data signal at an incorrect time, the delayed version of the clock signal also experiences that rising edge at an incorrect time, leading to the data signal being latched while it is at a logic low. This results in the Glitch_detect flag rising to indicate presence of a glitch.

This operation can be seen in FIG. 3B. At the first falling edge of the SOC clock signal CLK at time t1, the data signal is at a logic high, so Glitch_detect is latched at a logic low. At the second falling edge of the SOC clock signal CLK at time t2, which occurs due to the glitch # G1 showing up in the delayed version of the data signal as # G1_d, the data signal is at a logic low, so Glitch_detect is latched at a logic high to indicate presence of a glitch. At the third falling edge of the SOC clock signal CLK at time t3, the data signal is still at a logic high, therefore Glitch_detect is latched at a logic low. At the fourth falling edge of the SOC clock signal CLK at time t4, which occurs due to the glitch # G2 showing up in the delayed version of the data signal as # G2_d, the data signal is at a logic low, so Glitch_detect is latched at a logic high. Finally, at the fifth falling edge of the SOC clock signal CLK at time t5, the data signal is still at a logic high, so Glitch_detect is latched at a logic low. Therefore, it can be seen that the Glitch_detect signal has been latched high at times T2 and T4, which are times at which the glitches # G1_d and # G2_d riding on the delayed version of the data signal occur, but that the Glitch_detect signal has been latched low at times t1, t3, and t3, which are times at which no glitches are riding on the delayed version of the data signal.

While the glitch detectors 50 and 50' shown in FIGS. 2 and 3A are effective in some scenarios, they suffer drawbacks that render their designs less than ideal. For example, if the delay of the delay chain 52 begins at a low value while operating temperature of the SOC 49 is high, is the temperature of the SOC 49 reduces, then the delay of the delay chain may become less than ideal, making it possible that the glitch detector 50 or 50' fails to detect some (or any) glitches.

Therefore, further development into the area of glitch detectors is needed.

SUMMARY

Disclosed herein is a glitch detector including an input flip flop being clocked by a clock signal and having a non-inverting data output, an inverting data output, and a data input coupled to receive input from the inverting data output, with the input flip flop generating a divided version of the clock signal at the non-inverting data output. A configurable delay chain receives the divided version of the clock signal and generates a delayed version of the divided version of the clock signal as a delay output. An intermediate flip flop is clocked by the clock signal and has a data input coupled to receive the delay output, the intermediate flip flop being configured to generate an intermediate output as a function of the delay output. A logic circuit receives the divided version of the clock signal and the intermediate output, and generates a glitch detect signal by performing a logical operation on the divided version of the clock signal and the intermediate output.

An output flip flop may include a data input coupled to receive the glitch detect signal. The output flip flop may generate a latched version of the glitch detect signal when clocked.

The logical operation may be an exclusive NOR operation.

The logic circuit may include an exclusive NOR gate.

The configurable delay chain may contain a plurality of delay elements each being selectively enabled via control signals. A calibration control circuit may generate the control signals to selectively enable the plurality of delay elements. A second logic circuit may receive the latched version of the glitch detect signal and an enable glitch detection signal, and may enable a main control circuit based upon a logical AND between the latched version of the glitch detect signal and the enable glitch detection signal. The main control circuit may generate a calibration signal in response to an assertion of calibration done signal received from the calibration control circuit. The calibration control circuit may assert the calibration done signal upon completion of calibration of the calibration control circuit. A third logic circuit may receive the calibration signal and a periodic calibrate signal, and assert a start calibrate signal as a result of a logical AND operation between the calibration signal and the periodic calibrate signal. The calibration control circuit may begin calibration upon assertion of the start calibrate signal.

The calibration control circuit may generate the control signals by performing steps of: a) reducing a number of the plurality of delay elements enabled to zero; b) determining whether a glitch has been detected as a function of the glitch detect signal; c) if a glitch is not determined to be detected, and if the number of the plurality of delay elements enabled is not greater than a first number, generating the control signals so as to increase the number of the plurality of delay elements that are enabled by a fourth number, and returning to step b); d) if a glitch is not determined to be detected, and if the number of the plurality of delay elements enabled is greater than the first number, skipping to step g); e) if a glitch is determined to be detected, and if the number of the plurality of delay elements enabled is not less than a second number, generating the control signals so as to decrease the number of the plurality of delay elements that are enabled by a third number, then skipping to step g); f) if a glitch is determined to be detected, and if the number of the plurality of delay elements enabled is greater than the second number, skipping to step g); and g) ending calibration. The second number is less than the first number, the third number is less than the second number, and the fourth number is less than the third number.

Also disclosed herein is a glitch detection system including a main control circuit generating a calibration signal, a watchdog timer generating a periodic calibration signal as a function of passage of a given period of time, and a logic circuit generating a start calibration signal as a function of the calibration signal and the periodic calibration signal. A calibration sequencer generates a first calibration enable signal in response to the start calibration signal and assertion of a second calibration done signal, and generates a second calibration enable signal in response to the start calibration signal and assertion of a first calibration done signal. The glitch detection system includes first and second glitch detectors. A first calibration control circuit generates first control signals as a function of a first glitch detection signal from the first glitch detector and assertion of the first calibration enable signal, and asserts the first calibration done signal when calibration is complete. A second calibration control circuit generates second control signals as a function of a second glitch detection signal from the second glitch detector and assertion of the second calibration enable signal, and asserts the second calibration done signal when calibration is complete. The first glitch detector generates the first glitch detection signal as a function of a clock signal, the first glitch detector operating based upon control signals from the first calibration control circuit. The second glitch detector generates the second glitch detection signal as a function of the clock signal, the second glitch detector operating based upon control signals from the second calibration control circuit. Output logic generates a glitch detected signal as a function of the first and second glitch detection signals, and first and second calibration enable signals.

The logic circuit may be an OR gate.

The output logic may include a first AND gate receiving the first glitch detection signal and an inverted version of the first calibration enable signal as input, a second AND gate receiving the second glitch detection signal and an inverted version of the second calibration enable signal as input, and an OR gate receiving input from the first and second AND gates and generating the glitch detected signal at its output.

The main control circuit may perform steps of: a) asserting the calibration signal in response to assertion of the glitch detected signal; and b) monitoring the output logic for another assertion of the glitch detected signal, and when the glitch detected signal is asserted, returning to step a).

The first control signals may serve to set a selectable delay within the first glitch detector, and the second control signals may serve to set a selectable delay within the second glitch detector.

An integrated circuit disclosed herein includes an integrated circuit substrate and a plurality of glitch detectors formed in the integrated circuit substrate in spaced apart relation to one another. Each of the plurality of glitch detectors includes an input flip flop being clocked by a clock signal and having a non-inverting data output, an inverting data output, and a data input coupled to receive input from the inverting data output, with the input flip flop being configured to generate a divided version of the clock signal at the non-inverting data output. A configurable delay chain receives the divided version of the clock signal and generates a delayed version of the divided version of the clock signal as a delay output. An intermediate flip flop is clocked by the clock signal and has a data input coupled to receive the delay output. The intermediate flip flop generates an intermediate output as a function of the delay output. A logic circuit receives the divided version of the clock signal and the intermediate output, and generates a glitch detect signal by performing an exclusive NOR operation on the divided version of the clock signal and the intermediate output. An output flip flop has a data input coupled to receive the glitch detect signal and generates a latched version of the glitch detect signal when clocked.

The configurable delay chain may contain a plurality of delay elements each being selectively enabled via control signals. A calibration control circuit may generate the control signals to selectively enable the plurality of delay elements.

The calibration control circuit may generate the control signals by performing steps of: a) reducing a number of the plurality of delay elements enabled to zero; b) determining whether a glitch has been detected as a function of the glitch detect signal; c) if a glitch is not determined to be detected, and if the number of the plurality of delay elements enabled is not greater than a first number, generating the control signals so as to increase the number of the plurality of delay elements that are enabled by a fourth number, and returning to step b); d) if a glitch is not determined to be detected, and if the number of the plurality of delay elements enabled is greater than the first number, skipping to step g); e) if a glitch is determined to be detected, and if the number of the plurality of delay elements enabled is not less than a second number, generating the control signals so as to decrease the number of the plurality of delay elements that are enabled by a third number, then skipping to step g); f) if a glitch is determined to be detected, and if the number of the plurality of delay elements enabled is greater than the second number, skipping to step g); and g) ending calibration. The second number is less than the first number, the third number is less than the second number, and the fourth number is less than the third number.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
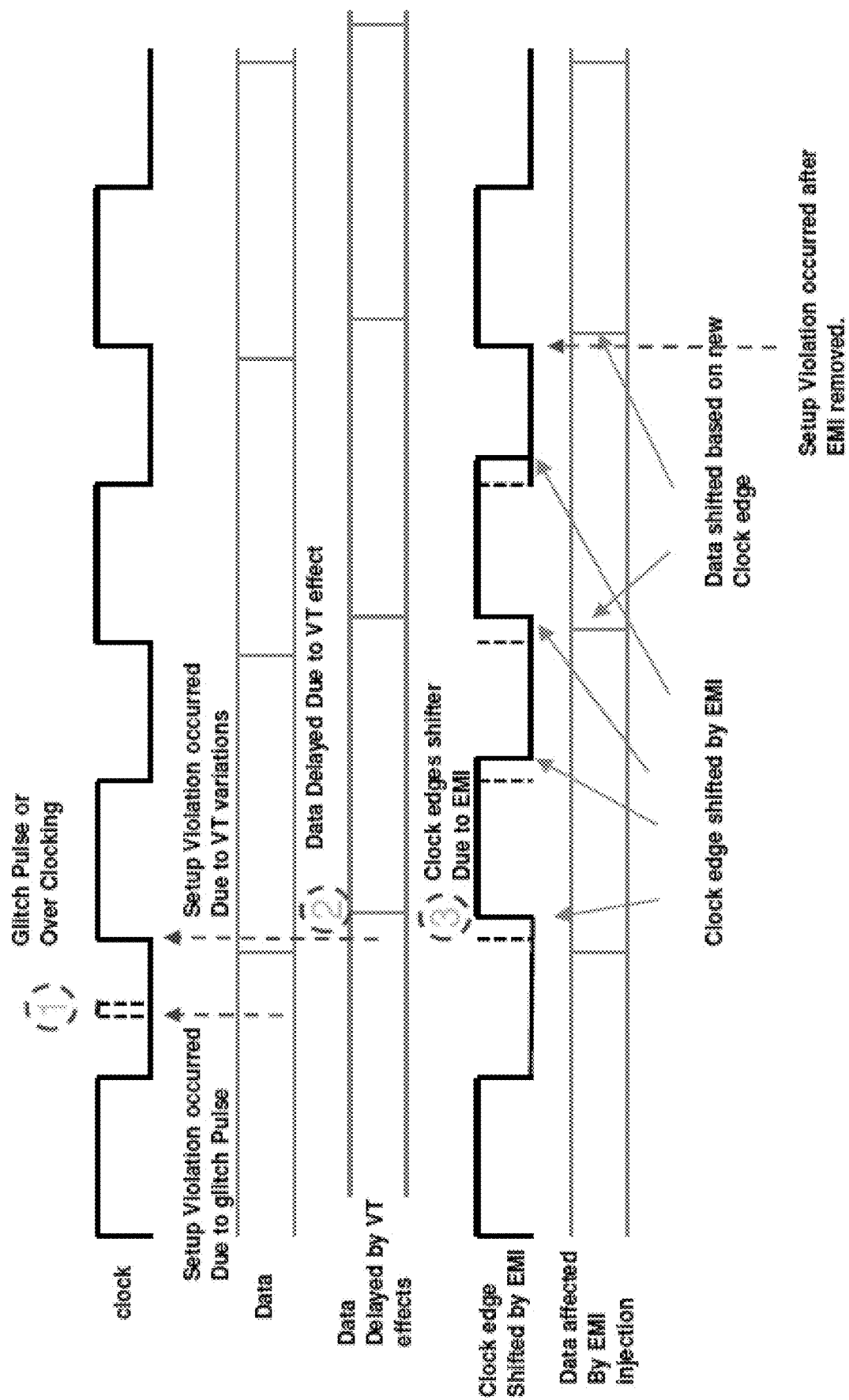
FIG. 1 is a graph showing possible glitches in SOC operation.
Figure 2A:
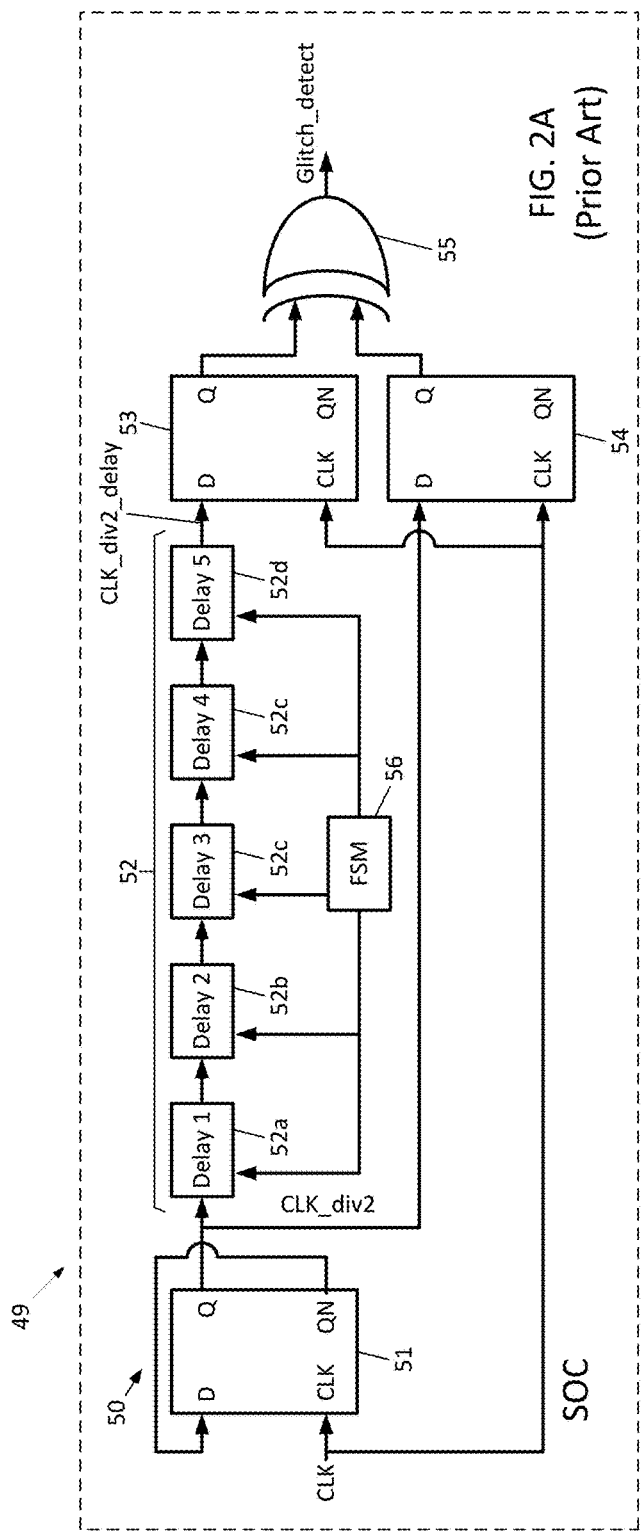
FIG. 2A is a block diagram of a first prior art glitch detector incorporated within a SOC.
Figure 2B:
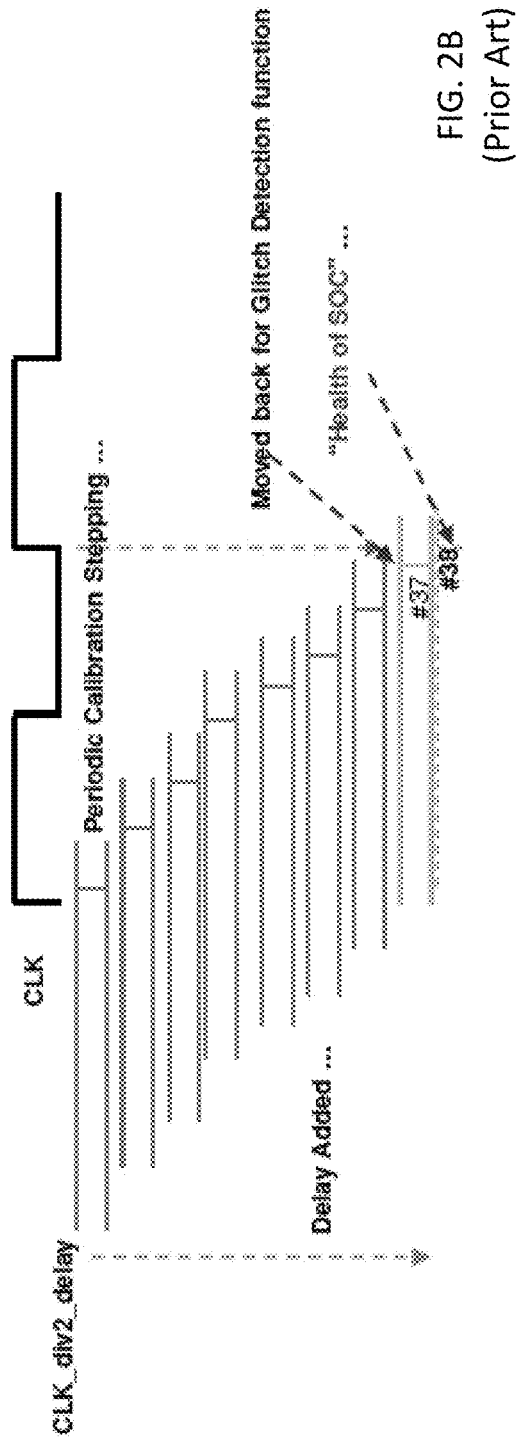
FIG. 2B is a timing diagram of the first prior art glitch detector of FIG. 2A showing the insertion of progressively larger delays by the delay chain.
Figure 2C:
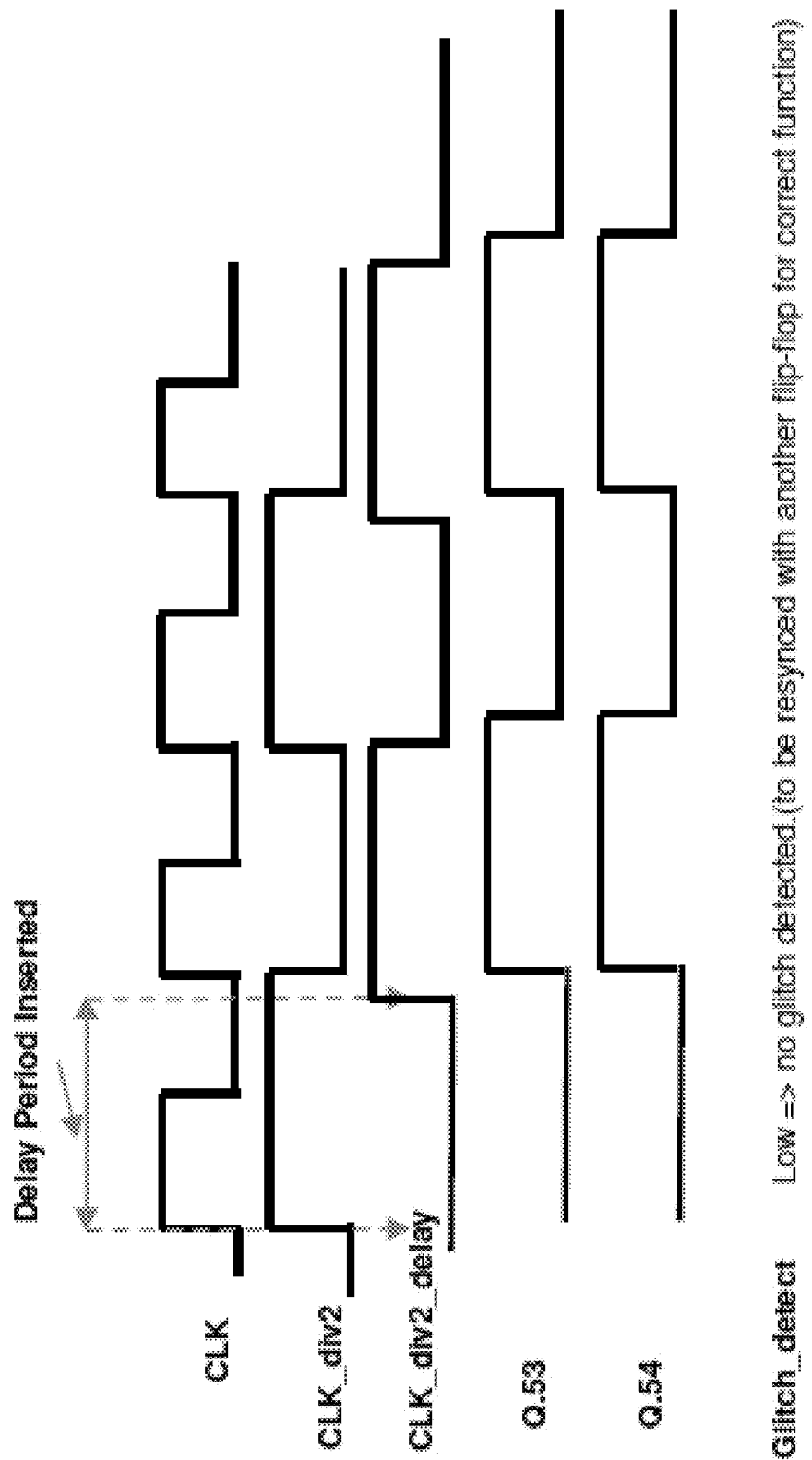
FIG. 2C is a timing diagram of the first prior art glitch detector of FIG. 2A in operation where no glitch is detected.
Figure 2D:
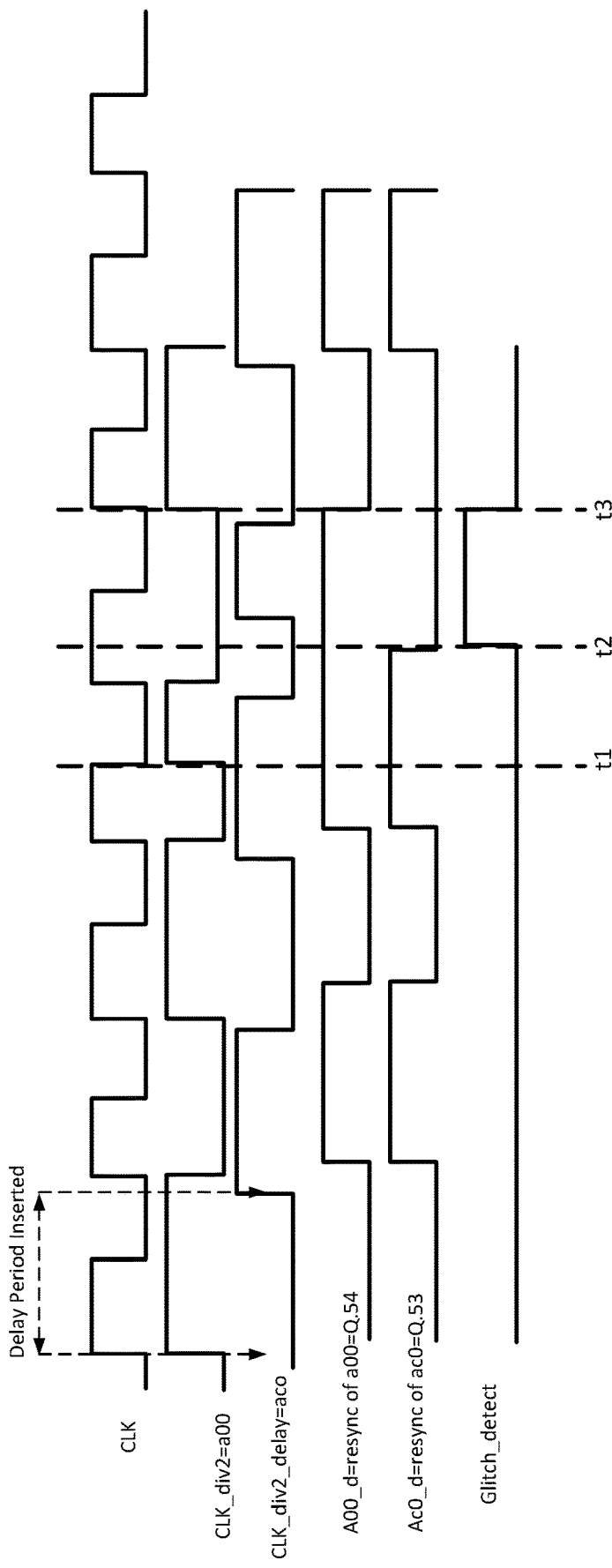
FIG. 2D is a timing diagram of the first prior art glitch detector of FIG. 2A in operation where a glitch is detected.
Figure 3A:
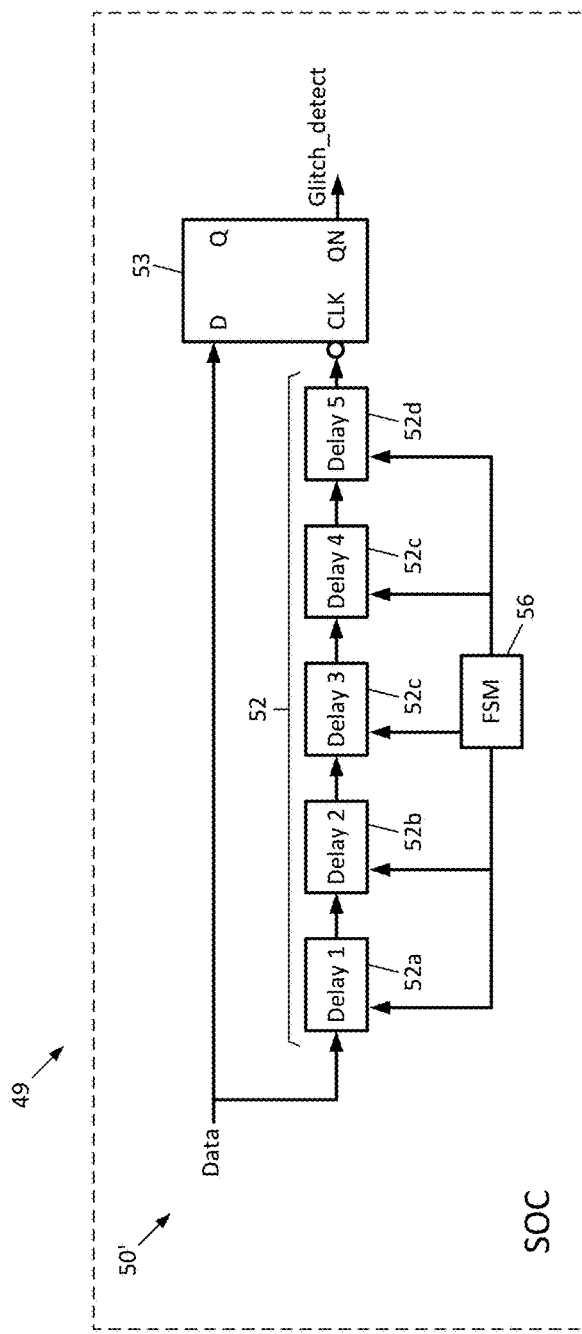
FIG. 3A is a block diagram of a second prior art glitch detector incorporated within a SOC.
Figure 3B:
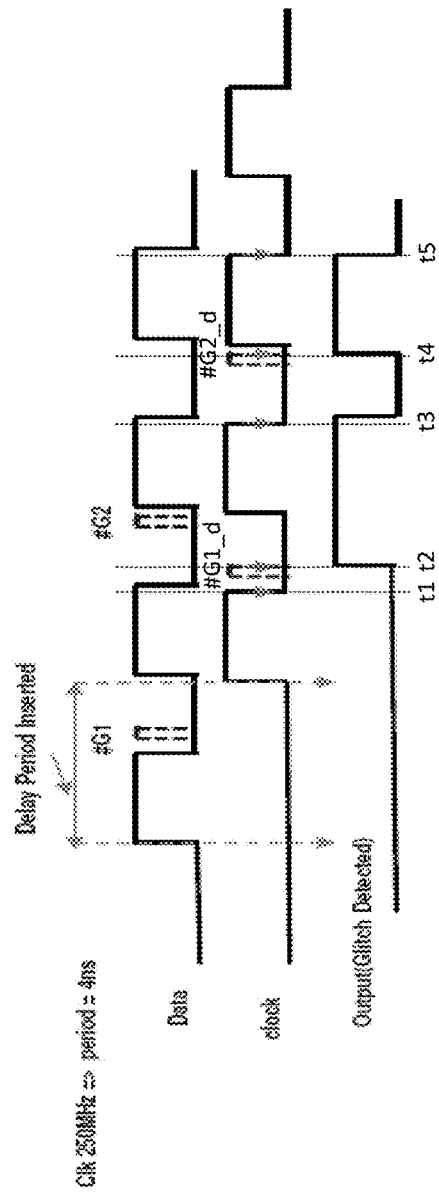
FIG. 3B is a timing diagram of the second prior art glitch detector of FIG. 3A in operation.
Figure 4:
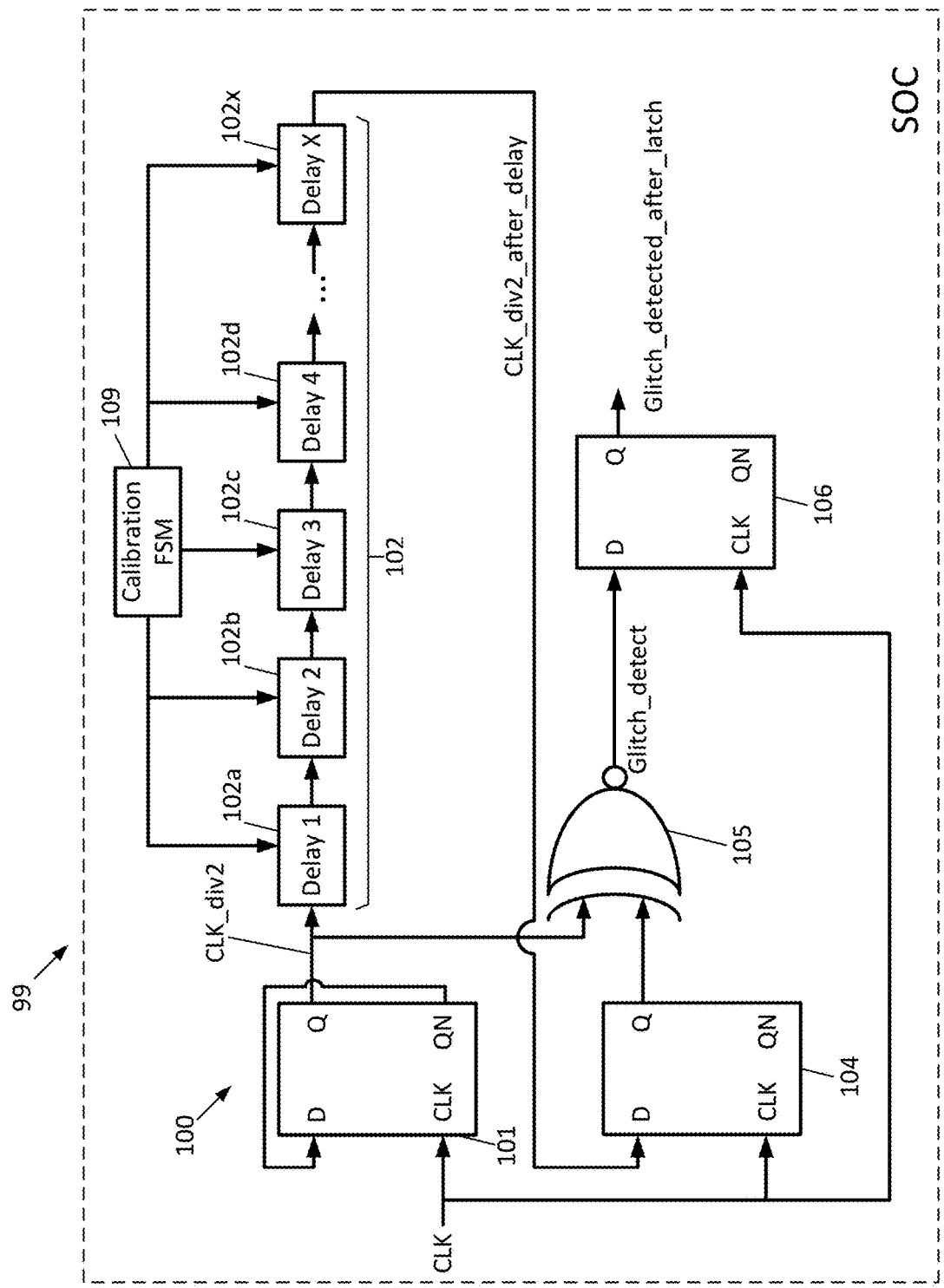
FIG. 4 is a block diagram of a glitch detector incorporated within a SOC, as disclosed herein.

A glitch detector 100 incorporated within a system on a chip (SOC) 99 is now described with initial reference to FIG. 4. Since the glitch detector 100 is incorporated within the SOC 99, understand that it is fabricated at the same time as the SOC 99, integrated within the same semiconductor substrate as the SOC 99. Thus, understand that the glitch detector 100 is subject to the same operating conditions and external attacks as the SOC 99, and can be used to determine the status of the SOC 99. Where the glitch detector 100 detects a glitch, it can be assumed that SOC 99 has experienced a glitch as well.

The glitch detector 100 includes an input flip flop 101 having a D input coupled to receive output from its QN output, a clock input receiving the SOC clock CLK, and a Q output providing output to a configurable delay chain 102. The configurable delay chain 102 is configurable in length and operable by a calibration finite state machine 109, receives input from the Q output of the input flip flop 101, and provides output to a D input of an intermediate flip flop 104. The configurable delay chain 102 includes x number of delay elements 102*a* . . . 102*x*, the number of which are selectable by the calibration FSM 109.

The intermediate flip flop 104 has a D input receiving output from the configurable delay chain 102, a clock input receiving the SOC clock CLK, and a Q output providing output to exclusive-NOR (XNOR) gate 105. The XOR gate also receives input from the Q output of the input flip flop 101, and provides output to a D input of an output flip flop 106. The output flip flop 106 has a clock input receiving the SOC clock CLK. The Q output of the flip flop 106 is also provides the output of the glitch detector 100 as the Glitch_detected_after_latch flag.

Figure 5:
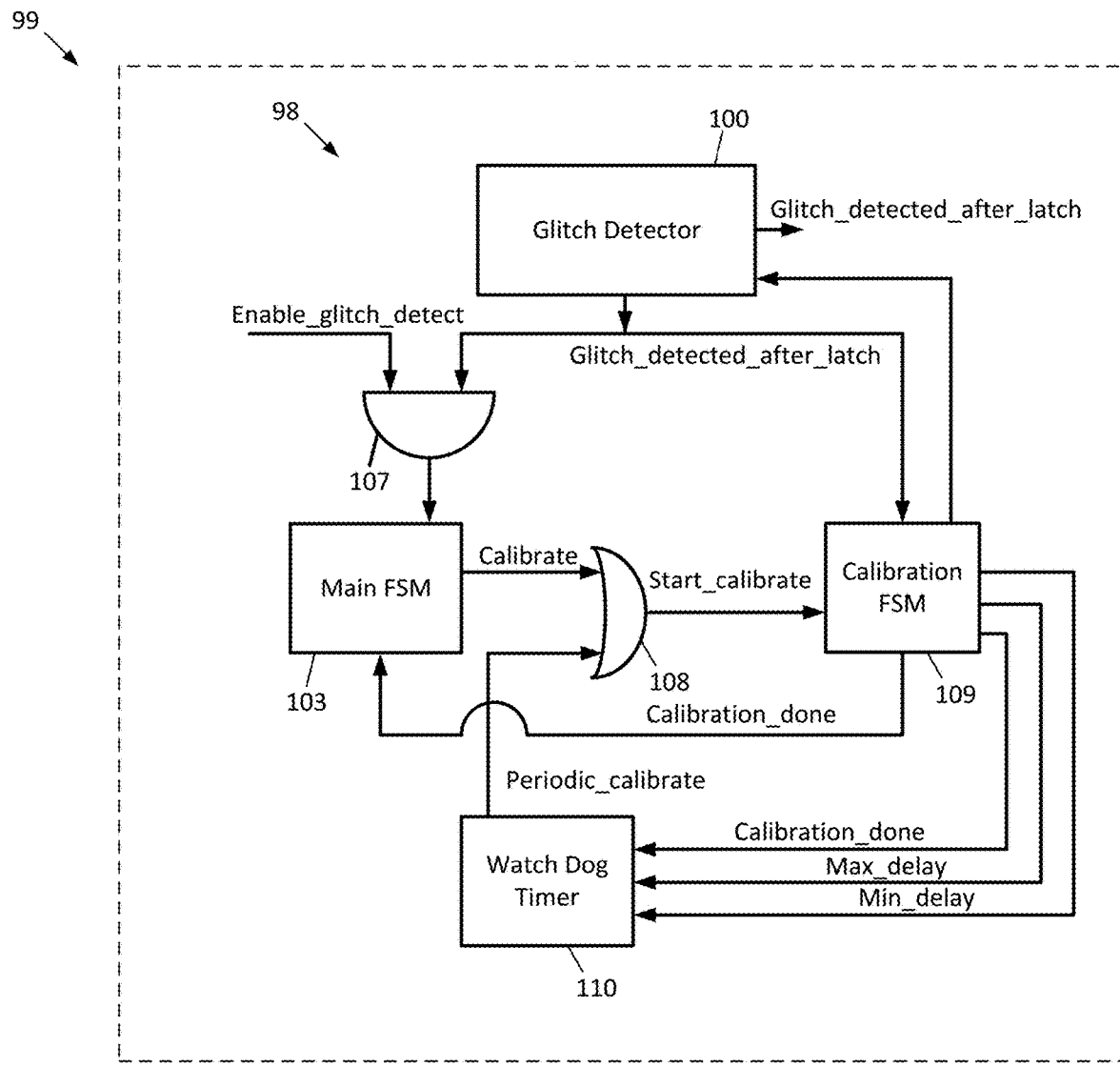
FIG. 5 is a block diagram of a glitch detection system incorporating the glitch detector of FIG. 4, as incorporated within a SOC.

The glitch detector 100 is part of a glitch detection system 98 incorporated within the SOC 99, as shown in FIG. 5. In addition to the glitch detector 100, the glitch detection system 98 includes AND gate 107 receiving input from a glitch detection enable signal Enable_glitch_detect and from the output, Glitch_detected_after_latch, of the glitch detector 100, and provides its output to the main finite state machine 103.

OR gate 108 receives a calibrate flag Calibrate from the main finite state machine 103 and a periodic calibrate flag Periodic_calibrate, and provides a start signal Start_calibrate to the calibration finite state machine 109. The calibration finite state machine 109 outputs the Calibration_done flag to the main finite state machine 103 and watch dog timer 110. The calibration finite state machine 109 also generates the maximum delay flag Max_delay and minimum delay flag Min_delay to the watchdog timer 110, which itself generated the periodic calibrate flag Periodic_calibrate.

Operation of the glitch detector 100 and glitch detection system 98 will now first be described in a general sense with reference to FIGS. 4-7, and then will thereafter be described with reference to specific examples in timing diagrams.

Figure 6:
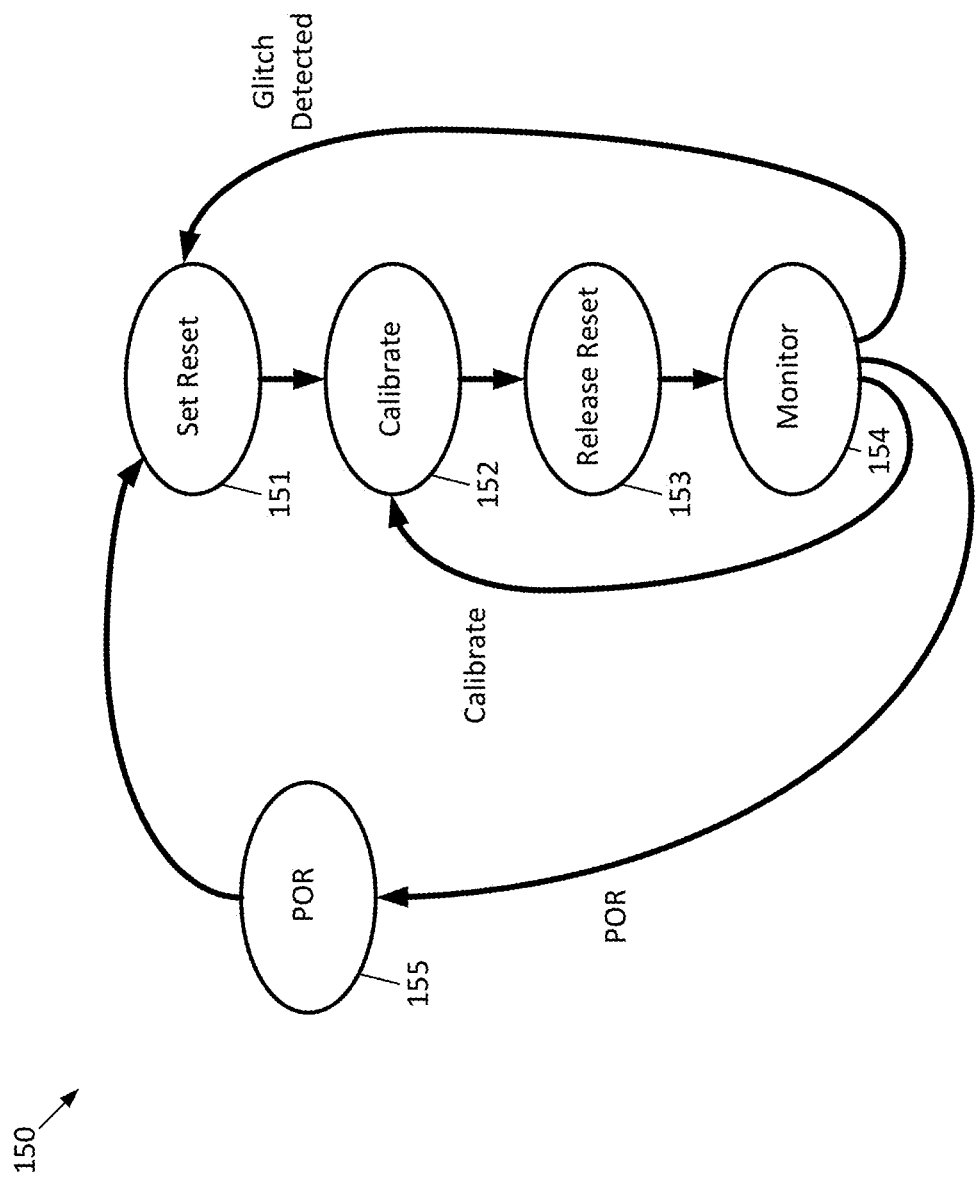
FIG. 6 is a state diagram of the main finite state machine of the glitch detector of FIG. 4.

Referring to the state diagram 150 in FIG. 6 of the main finite state machine 103, upon initial powerup or receipt of a power on reset signal (Block 155), the main finite state machine 103 enters its reset condition (Block 151), in which it begins the calibration process (Block 152) that serves to set the number of delay elements 102*a* . . . 102*x* of the delay chain 102 to be active. To begin the calibration process, the main finite state machine 103 asserts the Calibrate flag to the OR gate 108, which causes the OR gate 108 to assert the Start_calibrate signal to the calibration finite state machine 109.

Figure 7:
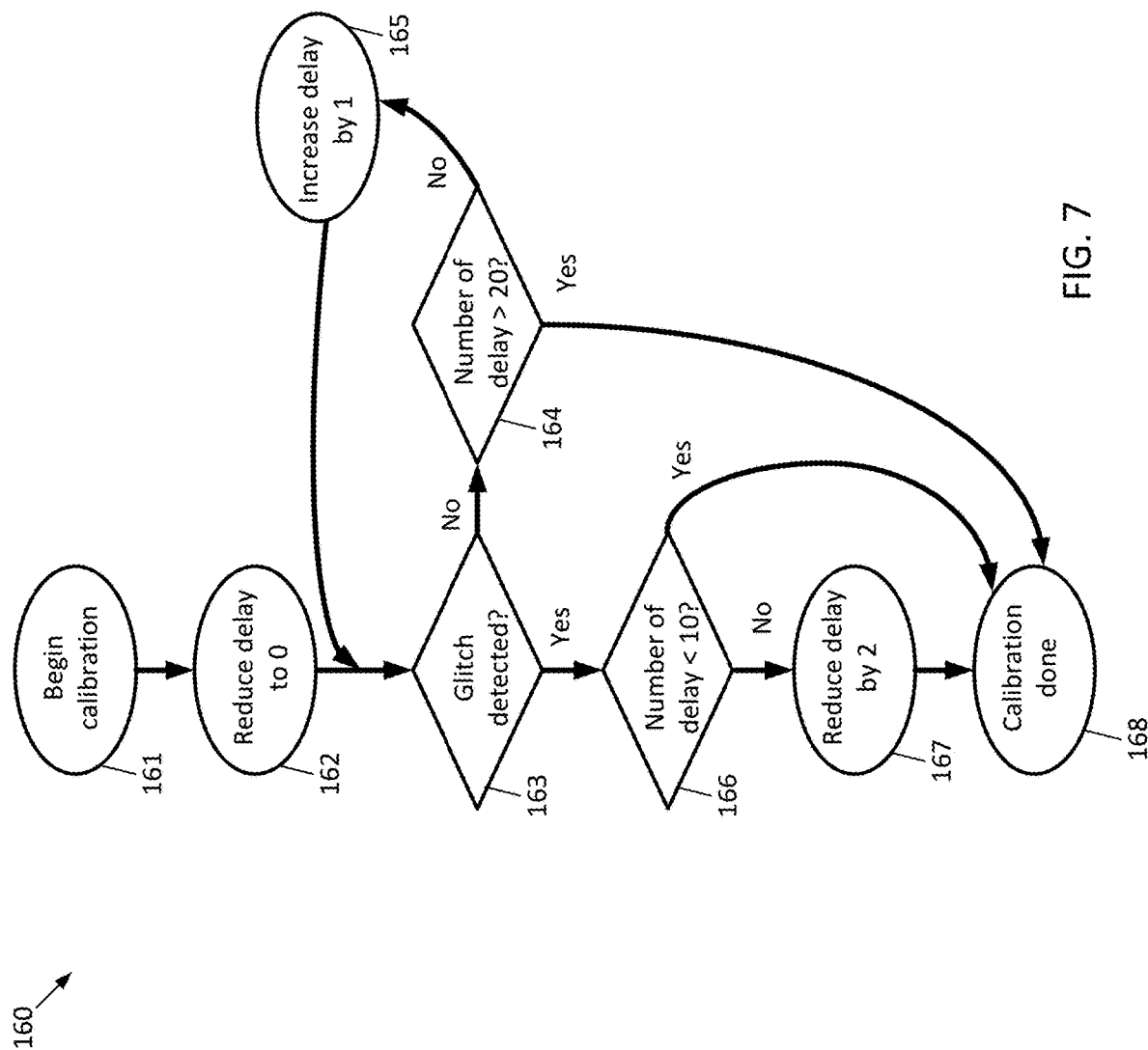
FIG. 7 is a state diagram of a calibration state machine utilized by the finite state machine of FIG. 6.

Referring to the state diagram 160 in FIG. 7 of the calibration finite state machine 109, after the calibration has begun (Block 161), the number of active delay elements 102*a* . . . 102*x* of the delay chain 102 is set to zero (Block 162). Then, glitch detection is performed (Block 163) by the glitch detector 100, the operation of which will be described below.

If a glitch is not detected, indicated by lack of assertion of the Glitch_detected_after_latch flag, then the number of active delay elements 102*a* . . . 102*x* of the delay chain 102 is evaluated. If the number of active delay elements 102*a* . . . 102*x* of the delay chain 102 is currently more than 20 (Block 164), then the calibration is done (Block 168), and the Calibration_Done flag is asserted by the calibration finite state machine 109.

If a glitch is detected, indicated by assertion of the Glitch_detected_after_latch flag, then the number of active delay elements 102*a* . . . 102*x* of the delay chain 102 is evaluated. If the number of active delay elements 102*a* . . . 102*x* of the delay chain 102 is currently less than 10 (Block 166), then the calibration is done (Block 168), and the Calibration_Done flag is asserted by the calibration finite state machine 109. If the number of active delay elements 102*a* . . . 102*x* of the delay chain 102 is currently not less than 10, then the number of active delay elements is reduced by two (Block 167), and then the calibration is done (Block 168), and the Calibration_Done flag is asserted by the calibration finite state machine 109.

Note that the values of 10 (for Block 166) and the values of 20 (for Block 164) are selected because in a best case operation of the SOC 99, a maximum of 20 delay elements is assumed to match an assumed 2 ns clock period, and because in a worst case operation of the SOC 99, a minimum of 10 delay cells are needed to match an assumed 2 ns clock period. Therefore, note that if the number of active delay elements 102*a* . . . 102*x* of the delay chain 102 selected at the end of calibration is less than 10, a first out of range flag WC can be asserted, or if the number of active delay elements selected at the end of the calibration is greater than 20, a second out of range flag BC can be asserted. Assertion of either of these flags indicates a severe operating conditions. Therefore, based on the assertion of either the WC or BC flags, the SOC 99 can shut down or take other action to account for the severe operating conditions.

Returning to the state diagram 150 in FIG. 6 of the main finite state machine 103, once the calibration is complete, the reset condition is exited (Block 153), and the monitoring condition is entered (Block 154) in which glitch detection is continually performed by the glitch detector 100. Once a glitch is detected by the glitch detector, then the reset state is re-entered (Block 151) so that calibration (Block 152) may be performed again.

Operation of the glitch detector 100 itself is now described. As explained, the calibration finite state machine 109 sets the number of active delay elements 102*a* . . . 102*x* of the delay chain 102. In response to a rising edge of the SOC clock signal CLK, the input flip flop 101 and intermediate flip flop 104 pass the values at their D inputs to their Q inputs. The input flip flop 101 receives the CLK_div2 signal at its D input, which is a divided by two version of the SOC clock signal CLK. Therefore, at each rising edge of the SOC clock signal CLK, the logic state of the CLK_div2 signal is passed at the Q output of the input flip flop 101, delayed by the delay chain 102 to produce CLK_div2_after_delay, which in turn is received at the D input of the intermediate flip flop 104, and output from the Q output of the intermediate flip flop 104. If CLK_div2_after_delay and CLK_div2 are equal, then the XNOR gate 105 outputs the Glitch_detect signal as a logic high. Therefore, the Glitch_detected_after_latch signal is asserted by the output flip flop 106, indicating that a glitch has been found. If, however, CLK_div2_after_delay and CLK_div2 are not equal, then the XNOR gate 105 outputs the Glitch_detect signal as a logic low. Therefore, the Glitch_detected_after_latch signal is not asserted by the output flip flop 106.

Figure 12:
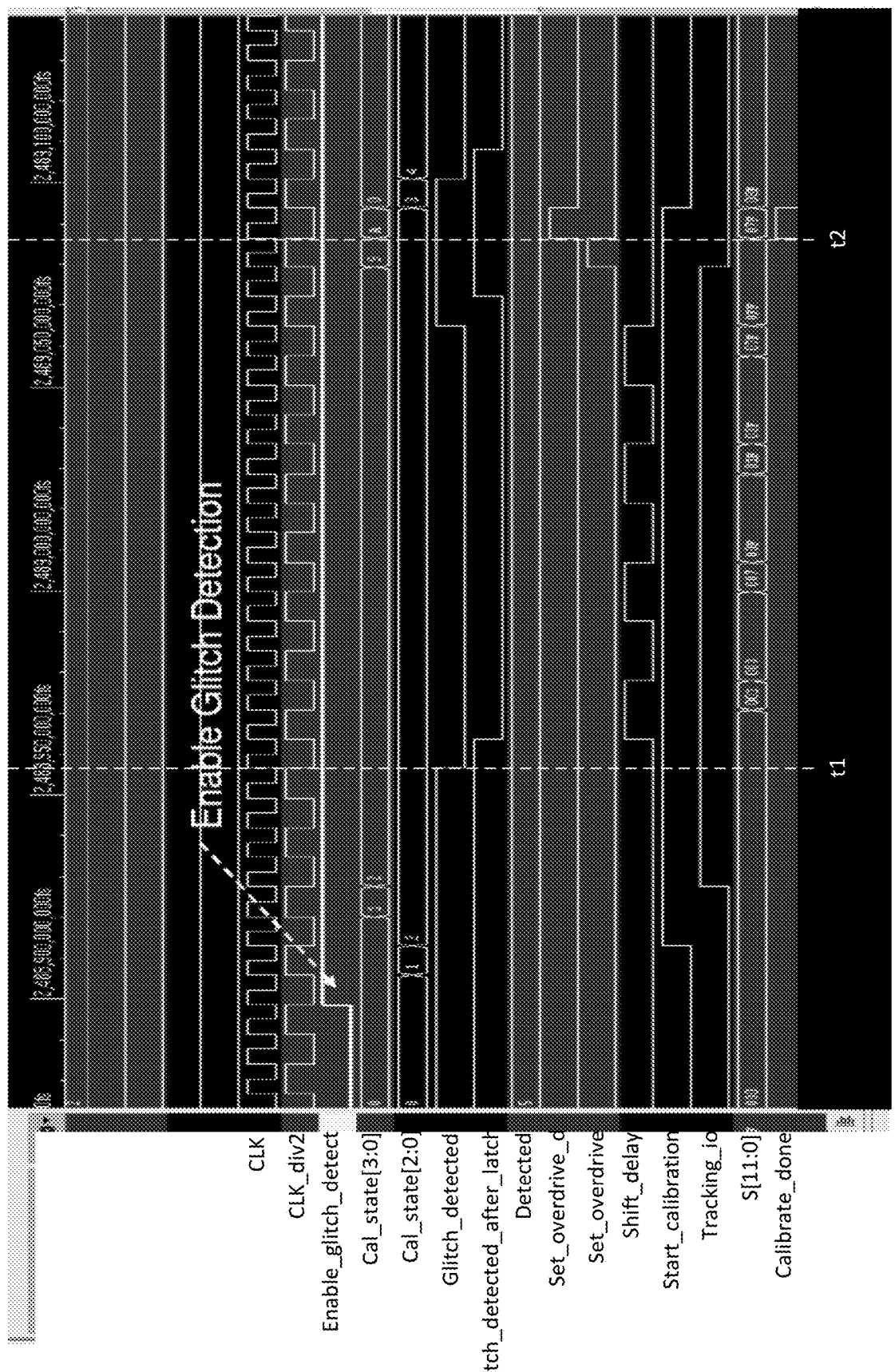
FIG. 12 is a timing diagram of the glitch detector of FIG. 4 in operation, where no glitch is detected.

Shown in FIG. 12 is a timing diagram of the glitch detector 100 in operation. Note that operation of the glitch detector 100 begins from a power on reset or enabled state. When powered on or enabled, the glitch detector 100 goes into calibration mode (performed by the calibration finite state machine 109 as explained above) to properly setup the number of active delay elements 102a . . . 102x and therefore be ready for glitch detection. In addition to the Glitch_detected signal indicating the presence of glitches, it can be used a calibration indicator to indicate that the number of active delay elements 102a . . . 102x is sufficient—this is seen in FIG. 12 where the Glitch_detected signal latch starts out high (indicating an insufficient number of active delay elements 102a . . . 102x), and then at time t1 transitions low indicating that the number of active delay elements 102a . . . 102x is sufficient. Note that calibration is now complete until time t2, where the Calibrate_done signal transitions.

Figure 13:
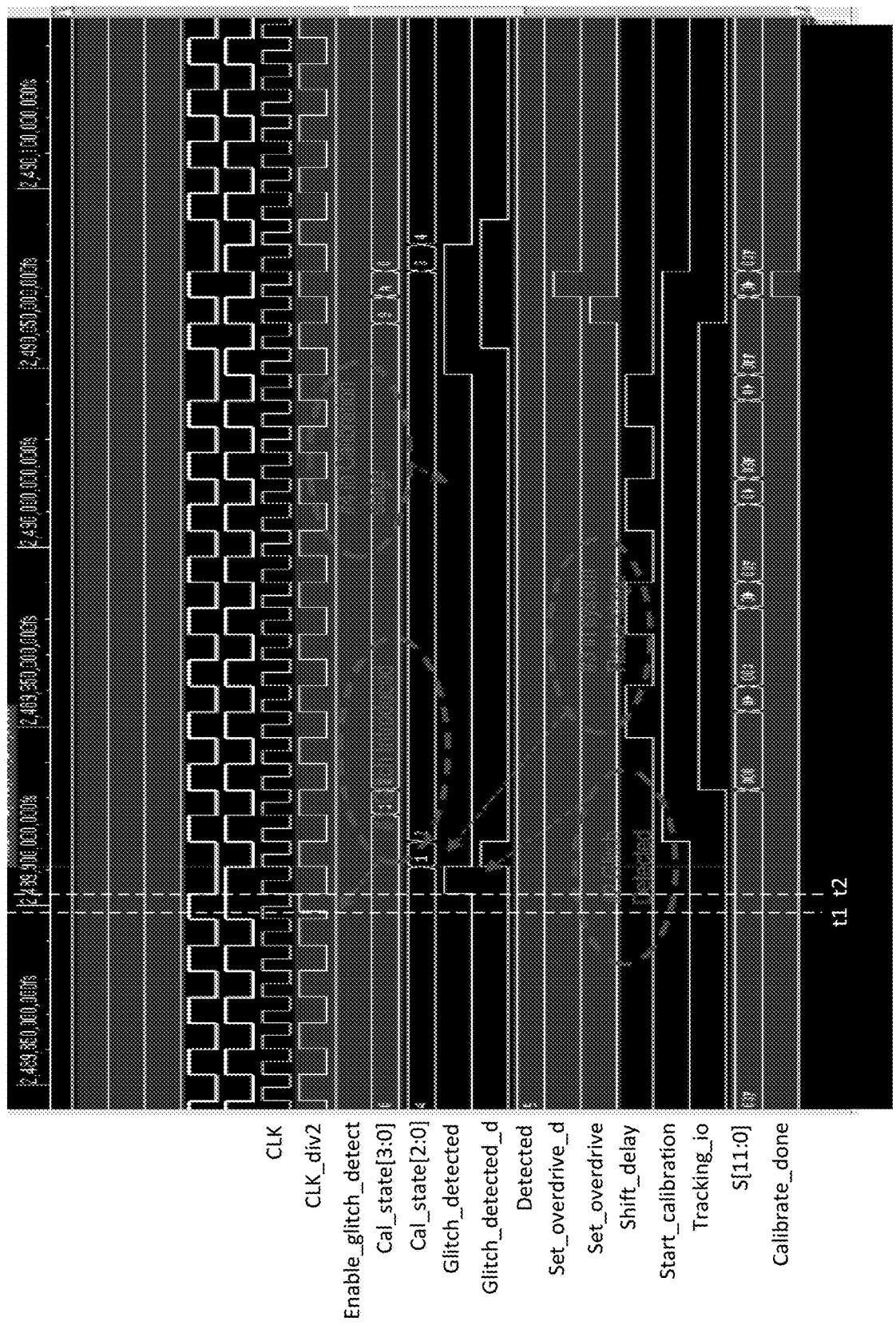
FIG. 13 is a timing diagram of the glitch detector of FIG. 4 in operation, where a glitch is detected.

An example of a glitch occurring can be seen starting at time t1 in FIG. 13. Here, a glitch is introduced into the CLK_div2 signal between times t1 and t2, and at time t2, as explained, the CLK_div2 and CLK_div2_after_delay signal will not be equal at the next rising edge of the SOC clock signal CLK, so the Glitch_detected signal rises to indicate the presence of the glitch.

Figure 14:
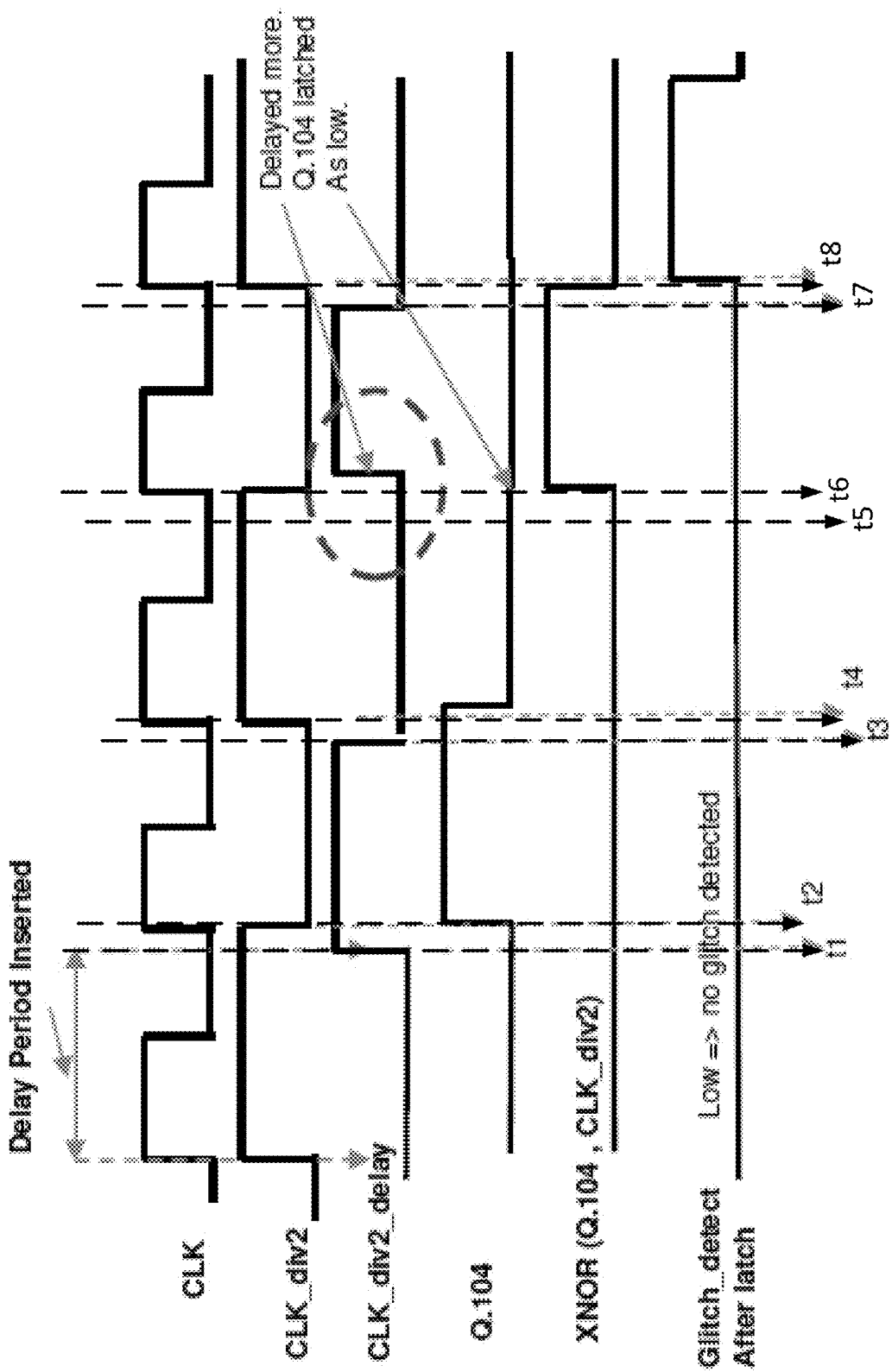
FIG. 14 is another timing diagram of the glitch detector of FIG. 4 in operation, where a glitch is detected.

Another example of operation can be seen in FIG. 14. Between times t1 and t2, CLK_div2 is high and the output of flip flop 104 (labeled as Q.104) is low, and therefore the output of the XNOR gate 105 will be low, meaning that Glitch_detected will be low and will be latched low as Glitch_detected_after_latch. Similarly, between times t3 and t4, CLK_div2 is low and the output of flip flop 104 is high, meaning that Glitch_detected will be low and will be latched low as Glitched_detected_after_latch. Between times t5 and t6, CLK_div2 is high while the output of flip flop 104 is also low, so at the rising edge of CLK that occurs at t6, the output of the XNOR gate 105 (which will be low at this point due to CLK_div2 and Q.104 having different values) is latched low as Glitch_detected_after_latch. However, after time t6, CLK_div2 falls low while the output of flip flop 104 remains low, meaning that the output of the XNOR gate 105 goes high after time t6. Therefore, at the next rising edge of CLK at time t8, the high output of the XNOR gate 105 is latched high as Glitch_detected_after_latch.

Figure 8:
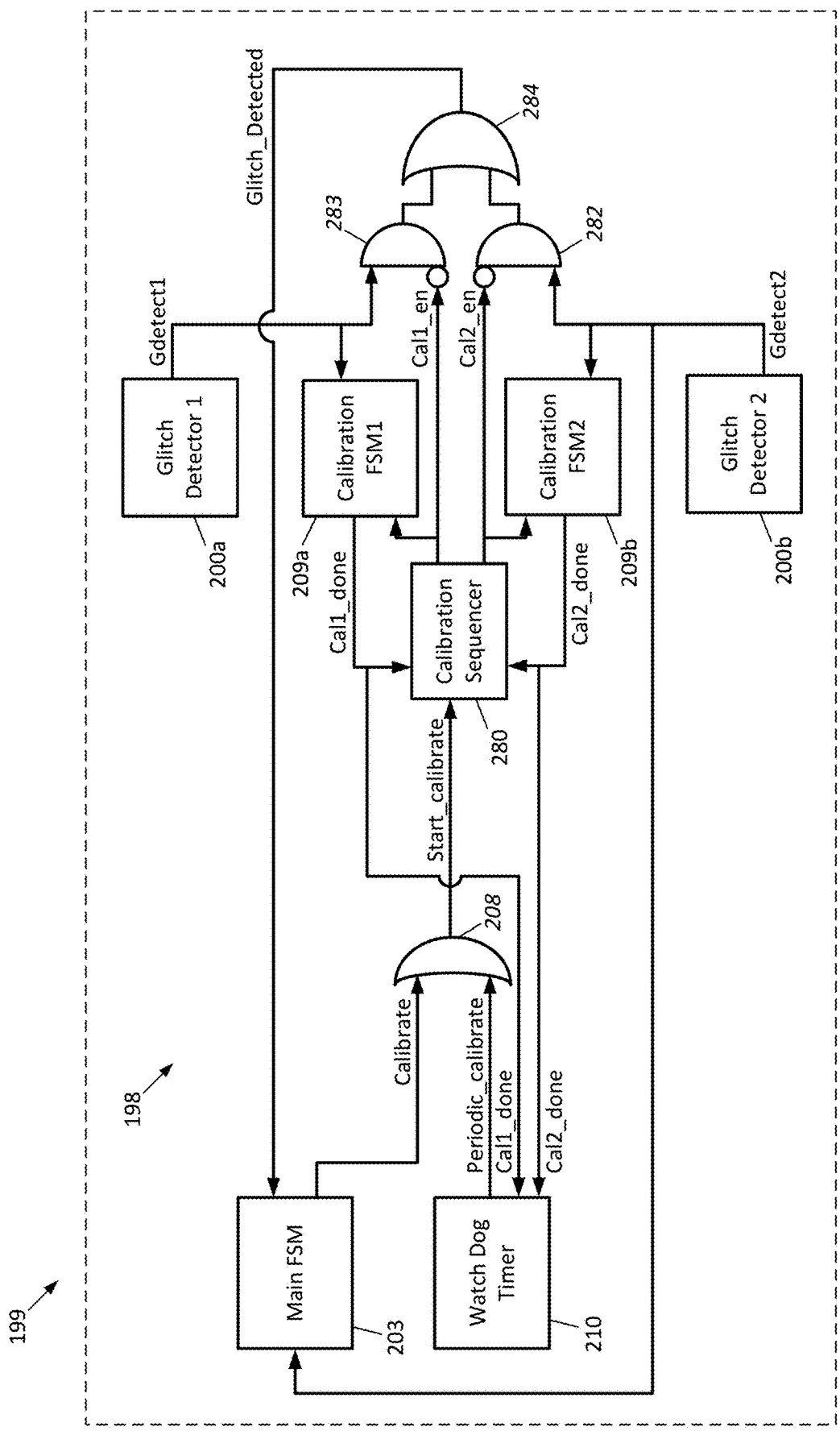
FIG. 8 is a block diagram of an alternative design of a glitch detection system incorporating multiple instances of the glitch detector of FIG. 4, as incorporated within a SOC.

An alternative design for a glitch detection system 198 incorporating multiple instances of the glitch detector 100 is now described with reference to FIG. 8. The glitch detection system 198 is incorporated within a SOC 199, and includes first and second glitch detectors 200a, 200b as well as first and second calibration finite state machines 209a, 209b. The first glitch detector 200a generates a first glitch detection signal Gdetect1, which is fed to AND gate 283 as input together with an inverted version of the enable signal Cal1_en for the first calibration finite state machine 209a. Similarly, the second glitch detector 200b generates a second glitch detection signal Gdetect2, which is fed to AND gate 282 as input together with an inverted version of the enable signal Cal2_en for the second calibration finite state machine 209b. The AND gates 282, 283 provide their output to OR gate 284 as input, which generates the Glitch_Detected signal at its output.

The first calibration finite state machine 209a generates a signal Cal1_done indicating completion of its calibration, and feeds this signal to calibration sequencer 280. The second calibration finite state machine 209b generates a signal Cal2_done indicating completion of its calibration, and feeds this signal to calibration sequencer 208 as well. It is the calibration sequencer 280 which generates the Cal1_en and Cal2_en signals as a function of the Start_calibrate signal, as will be explained below.

The main finite state machine 203 generates the Calibrate signal to OR gate 208, and the Watch Dog Timer 210 generates the Periodic_Calibrate signal to OR gate 208.

The glitch detectors 200a, 200b operate as described above, as do the calibration finite state machines 209a, 209b, watchdog timer 210, and main finite state machine 203.

Figure 9:
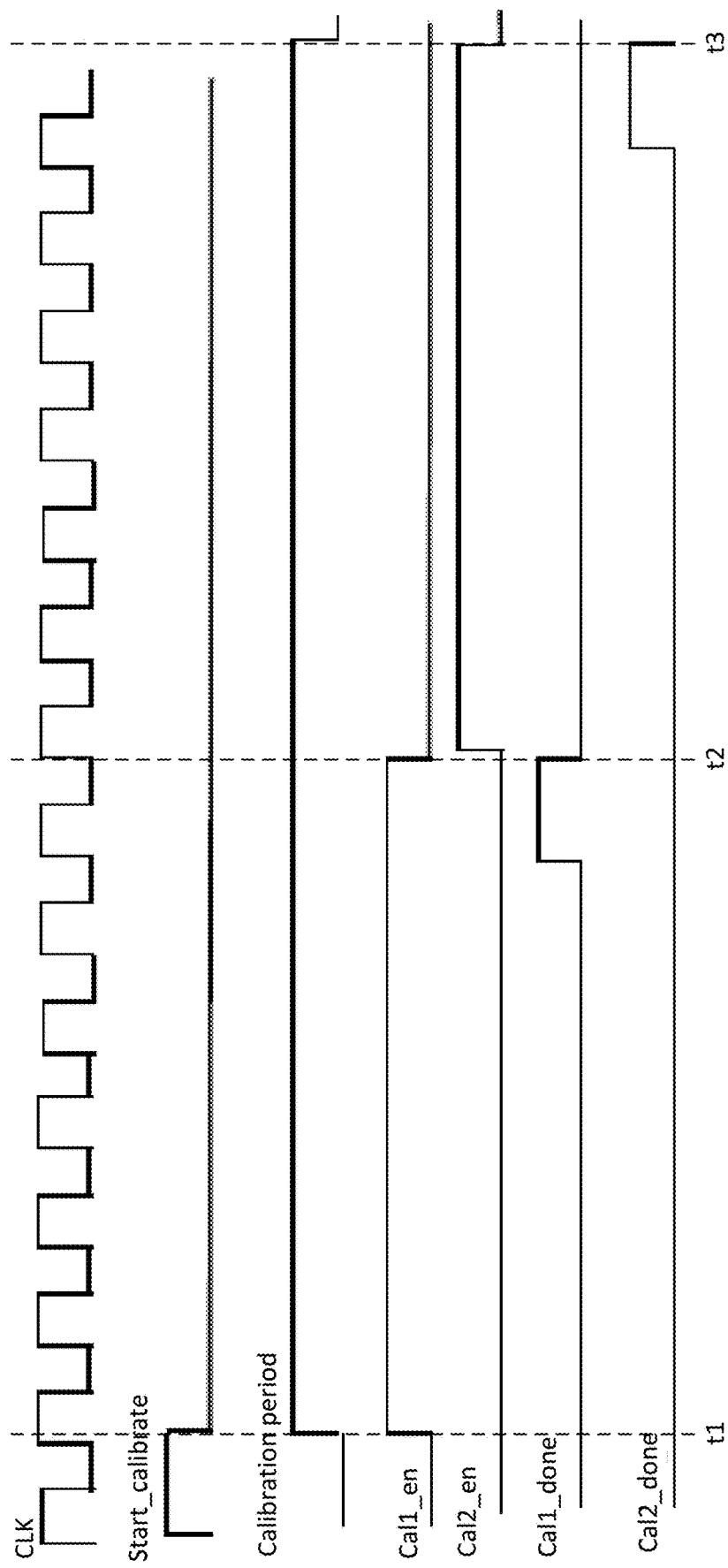
FIG. 9 is a timing diagram of the glitch detection system of FIG. 8 in operation.

Operation of the calibration sequencer 280, which in this embodiment controls the calibration finite state machines 209a, 209b is as follows, with additional reference to FIG. 9. Upon the falling edge of the Start_calibrate signal at time t1, once the Start_calibrate signal has been asserted, the calibration sequencer 280 begins the calibration period. At the start of the calibration period at time t1, the calibration sequencer 280 asserts the Cal1_en signal. The first calibration finite state machine 209a, in response, performs its calibration on the first glitch detector 200a, which proceeds as described above. When this calibration is complete, the first calibration finite state machine 209a asserts the Cal1_done signal, and at time t2 at the falling edge of the Cal1_done signal, Cal1_en is deasserted by the calibration sequencer 280, and Cal2_en is then asserted. Then, the second calibration finite state machine 209b, in response, performs its calibration on the second glitch detector 200b, which proceeds as described above. When this calibration is complete, the second calibration finite state machine 209b asserts the Cal2_done signal, and at the falling edge of the Cal2_done signal at time t3, the calibration period ends.

As can be appreciated, the purpose of the AND gates 283 and 282 respectively receiving the Cal1_en and Cal2_en signals is to enable or disable passing of the Gdetect1 and Gdetect2 signal. Thus, while the calibration finite state machine 209a is performing its calibration, Gdetect1 is not passed by the AND gate 283, and while the calibration finite state machine 209b is performing its calibration, Gdetect2 is not passed by the AND gate 283. The result is that the OR gate 284 passes the asserted Gdetect1 or Gdetect2 signal that it receives as Glitch_Detected so as to show detection of a glitch.

Figure 10:
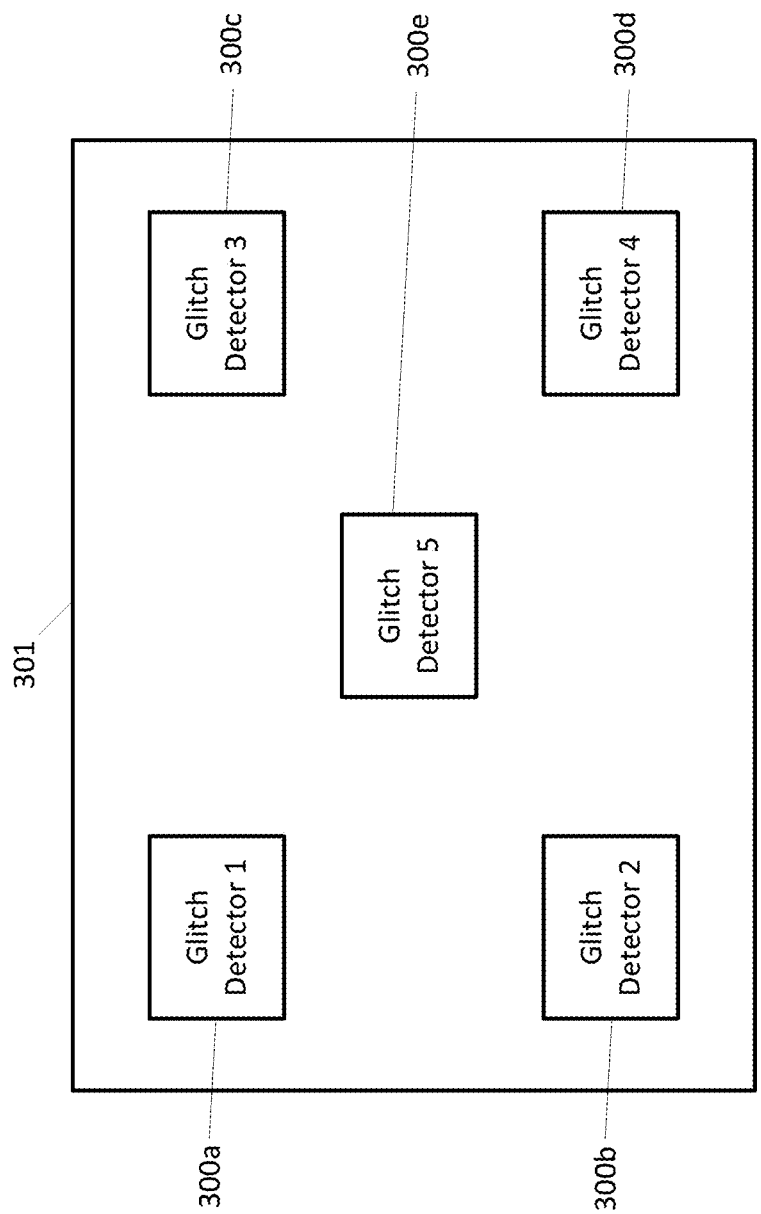
FIG. 10 is a block diagram of a SOC incorporating multiple instances of the glitch detector of FIG. 4.
Figure 11:
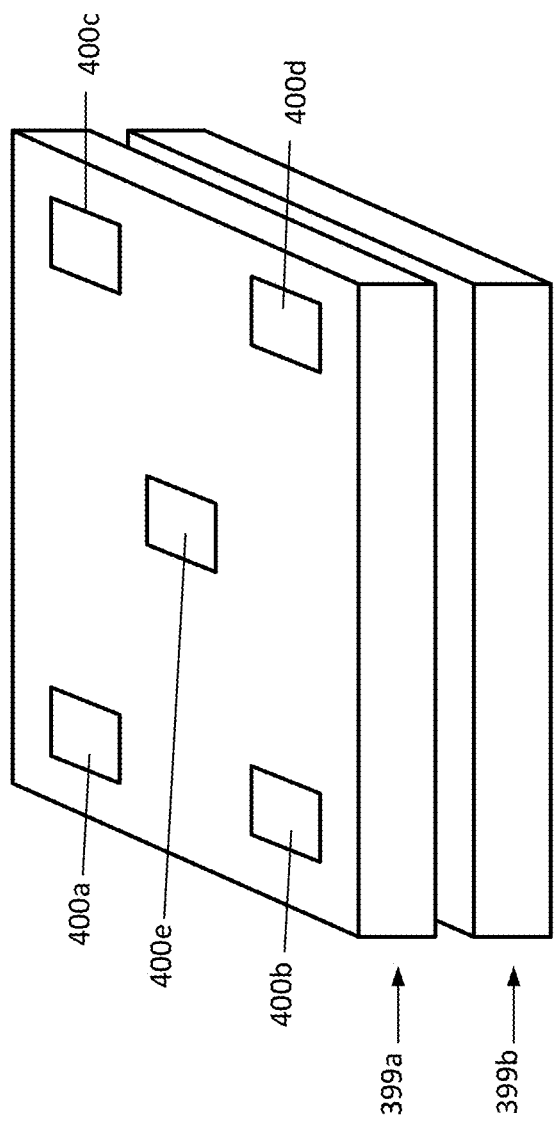
FIG. 11 is a block diagram of package of two chips each incorporating multiple instances of the glitch detector of FIG. 4.

As shown in FIG. 10, multiple instances of a glitch detector 300a-300e, identical to those described above, may be incorporated within or formed on the integrated circuit substrate of an integrated circuit (IC) 301 so that glitches induced at operation conditions experienced by different portions of the IC 301 can be detected.

Expanding upon this, in a stacked arrangement of integrated circuits (ICs) or chips 399a, 399b, multiple instanced of a glitch detector 300a-300e may each be incorporated within or formed on the respective integrated circuit substrates of the ICs 399a, 399b. With such an arrangement, there are signals and voltages feed between the ICs 399a and 399b, and feedthroughs for supply voltage VDD may be at corners of the ICs 399a, 399b. These feedthroughs may carry conditions that induce glitches, and thus, the glitch detectors 300a-300e may be placed at locations adjacent to the feedthroughs.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A glitch detector, comprising:
an input flip flop being clocked by a clock signal and having a non-inverting data output, an inverting data output, and a data input coupled to receive input from the inverting data output, wherein the input flip flop is configured to generate a divided version of the clock signal at the non-inverting data output;
a configurable delay chain receiving the divided version of the clock signal and configured to generate a delayed version of the divided version of the clock signal as a delay output;
an intermediate flip flop being clocked by the clock signal and having a data input coupled to receive the delay output, wherein the intermediate flip flop is configured to generate an intermediate output as a function of the delay output; and
a logic circuit configured to receive the divided version of the clock signal and the intermediate output, and to generate a glitch detect signal by performing a logical operation on the divided version of the clock signal and the intermediate output.

2. The glitch detector of claim 1, further comprising an output flip flop having a data input coupled to receive the glitch detect signal and being configured to generate having a latched version of the glitch detect signal when clocked.

3. The glitch detector of claim 1, wherein the logical operation is an exclusive NOR operation.

4. The glitch detector of claim 1, wherein the logic circuit comprises an exclusive NOR gate.

5. The glitch detector of claim 1, wherein the configurable delay chain contains a plurality of delay elements each being selectively enabled via control signals; and further comprising a calibration control circuit configured to generate the control signals to selectively enable the plurality of delay elements.

6. The glitch detector of claim 5, further comprising a second logic circuit configured to receive the latched version of the glitch detect signal and an enable glitch detection signal, and to enable a main control circuit based upon a logical AND between the latched version of the glitch detect signal and the enable glitch detection signal.

7. The glitch detector of claim 6, wherein the main control circuit is configured to generate a calibration signal in response to an assertion of calibration done signal received from the calibration control circuit; and wherein the calibration control circuit asserts the calibration done signal upon completion of calibration of the calibration control circuit.

8. The glitch detector of claim 7, further comprising a third logic circuit configured to receive the calibration signal and a periodic calibrate signal, and to assert a start calibrate signal as a result of a logical AND operation between the calibration signal and the periodic calibrate signal; and wherein the calibration control circuit is configured to begin calibration upon assertion of the start calibrate signal.

9. The glitch detector of claim 5, wherein the calibration control circuit generates the control signals by performing steps of:
a) reducing a number of the plurality of delay elements enabled to zero;
b) determining whether a glitch has been detected as a function of the glitch detect signal;
c) if a glitch is not determined to be detected, and if the number of the plurality of delay elements enabled is not greater than a first number, generating the control signals so as to increase the number of the plurality of delay elements that are enabled by a fourth number, and returning to step b);
d) if a glitch is not determined to be detected, and if the number of the plurality of delay elements enabled is greater than the first number, skipping to step g);
e) if a glitch is determined to be detected, and if the number of the plurality of delay elements enabled is not less than a second number, generating the control signals so as to decrease the number of the plurality of delay elements that are enabled by a third number, then skipping to step g);
f) if a glitch is determined to be detected, and if the number of the plurality of delay elements enabled is greater than the second number, skipping to step g); and
g) ending calibration; and
wherein the second number is less than the first number, the third number is less than the second number, and the fourth number is less than the third number.

10. A glitch detection system, comprising:
a main control circuit configured to generate a calibration signal;
a watchdog timer configured to generate a periodic calibration signal as a function of passage of a given period of time;
a logic circuit configured to generate a start calibration signal as a function of the calibration signal and the periodic calibration signal;
a calibration sequencer configured to generate a first calibration enable signal in response to the start calibration signal and assertion of a second calibration done signal, and to generate a second calibration enable signal in response to the start calibration signal and assertion of a first calibration done signal;
first and second glitch detectors;
a first calibration control circuit configured to generate first control signals as a function of a first glitch detection signal from the first glitch detector and assertion of the first calibration enable signal, and to assert the first calibration done signal when calibration is complete;
a second calibration control circuit configured to generate second control signals as a function of a second glitch detection signal from the second glitch detector and assertion of the second calibration enable signal, and to assert the second calibration done signal when calibration is complete;
wherein the first glitch detector is configured to generate the first glitch detection signal as a function of a clock signal, the first glitch detector operating based upon control signals from the first calibration control circuit;
wherein the second glitch detector is configured to generate the second glitch detection signal as a function of the clock signal, the second glitch detector operating based upon control signals from the second calibration control circuit; and
output logic configured to generate a glitch detected signal as a function of the first and second glitch detection signals, and first and second calibration enable signals.

11. The glitch detection system of claim 10, wherein the logic circuit comprises an OR gate.

12. The glitch detection system of claim 10, wherein the output logic comprises:
- a first AND gate receiving the first glitch detection signal and an inverted version of the first calibration enable signal as input;
- a second AND gate receiving the second glitch detection signal and an inverted version of the second calibration enable signal as input; and
- an OR gate receiving input from the first and second AND gates and generating the glitch detected signal at its output.

13. The glitch detection system of claim 10, wherein the main control circuit is configured to perform steps of:
- a) asserting the calibration signal in response to assertion of the glitch detected signal; and
- b) monitoring the output logic for another assertion of the glitch detected signal, and when the glitch detected signal is asserted, return to step a).

14. The glitch detection system of claim 10, wherein the first control signals serve to set a selectable delay within the first glitch detector; and wherein the second control signals serve to set a selectable delay within the second glitch detector.

15. An integrated circuit, comprising:
- an integrated circuit substrate;
- a plurality of glitch detectors formed in the integrated circuit substrate in spaced apart relation to one another;
- wherein each of the plurality of glitch detectors comprises:
  - an input flip flop being clocked by a clock signal and having a non-inverting data output, an inverting data output, and a data input coupled to receive input from the inverting data output, wherein the input flip flop is configured to generate a divided version of the clock signal at the non-inverting data output;
  - a configurable delay chain receiving the divided version of the clock signal and configured to generate a delayed version of the divided version of the clock signal as a delay output;
  - an intermediate flip flop being clocked by the clock signal and having a data input coupled to receive the delay output, wherein the intermediate flip flop is configured to generate an intermediate output as a function of the delay output;
  - a logic circuit configured to receive the divided version of the clock signal and the intermediate output, and to generate a glitch detect signal by performing an exclusive NOR operation on the divided version of the clock signal and the intermediate output; and
  - an output flip flop having a data input coupled to receive the glitch detect signal and configured to generate a latched version of the glitch detect signal when clocked.

16. The integrated circuit of claim 15, wherein the configurable delay chain contains a plurality of delay elements each being selectively enabled via control signals; and further comprising a calibration control circuit configured to generate the control signals to selectively enable the plurality of delay elements.

17. The integrated circuit of claim 16, wherein the calibration control circuit generates the control signals by performing steps of:
- a) reducing a number of the plurality of delay elements enabled to zero;
- b) determining whether a glitch has been detected as a function of the glitch detect signal;
- c) if a glitch is not determined to be detected, and if the number of the plurality of delay elements enabled is not greater than a first number, generating the control signals so as to increase the number of the plurality of delay elements that are enabled by a fourth number, and returning to step b);
- d) if a glitch is not determined to be detected, and if the number of the plurality of delay elements enabled is greater than the first number, skipping to step g);
- e) if a glitch is determined to be detected, and if the number of the plurality of delay elements enabled is not less than a second number, generating the control signals so as to decrease the number of the plurality of delay elements that are enabled by a third number, then skipping to step g);
- f) if a glitch is determined to be detected, and if the number of the plurality of delay elements enabled is greater than the second number, skipping to step g); and
- g) ending calibration; and wherein the second number is less than the first number, the third number is less than the second number, and the fourth number is less than the third number.

* * * * *